United States Patent [19]
Kameya

[11] Patent Number: 4,701,723
[45] Date of Patent: Oct. 20, 1987

[54] CONNECTION CONSTRUCTION FOR ELECTRONIC COMPONENT

[75] Inventor: Kazuo Kameya, Isurugashima, Japan
[73] Assignee: Elmec Corporation, Saitama, Japan
[21] Appl. No.: 826,347
[22] Filed: Feb. 5, 1986
[30] Foreign Application Priority Data
  Feb. 5, 1985 [JP] Japan .............................. 60-14974[U]
[51] Int. Cl.[4] .............................................. H01P 5/02
[52] U.S. Cl. ...................................... 333/33; 333/238; 333/260; 439/78
[58] Field of Search .................. 333/33, 238, 246, 247, 333/260; 361/399, 404; 339/17 M, 17 LM

[56] References Cited
U.S. PATENT DOCUMENTS
3,651,432  3/1972  Henschen et al. ..................... 333/33
3,686,624  8/1972  Napoli et al. ....................... 333/33 X
4,208,642  6/1980  Saunders .............................. 333/246
4,310,811  1/1982  Currie ................................ 333/33 X
4,543,544  9/1985  Ziegner ............................ 333/238 X Primary Examiner—Paul Gensler
Attorney, Agent, or Firm—Wegner & Bretschneider

[57] ABSTRACT

This connection construction for an electronic component includes a circuit board, a circuit pattern on the circuit board, an external connection terminal mounted to the circuit board and connected to the circuit pattern, a ground electrode opposing the external connection terminal, and a mass of dielectric material interposed between the ground electrode and the external connection terminal. Thereby proper connection is obtained for the circuit board, without introducing any undesirable delay, or deterioration or degradation of output signal therefrom. Thus, a connection construction for an electronic component is obtained which is particularly suitable for handling high speed signals.

10 Claims, 8 Drawing Figures

U.S. Patent  Oct. 20, 1987  Sheet 1 of 2  4,701,723
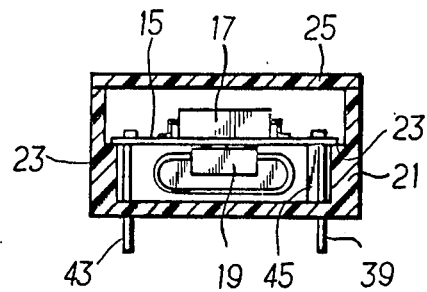
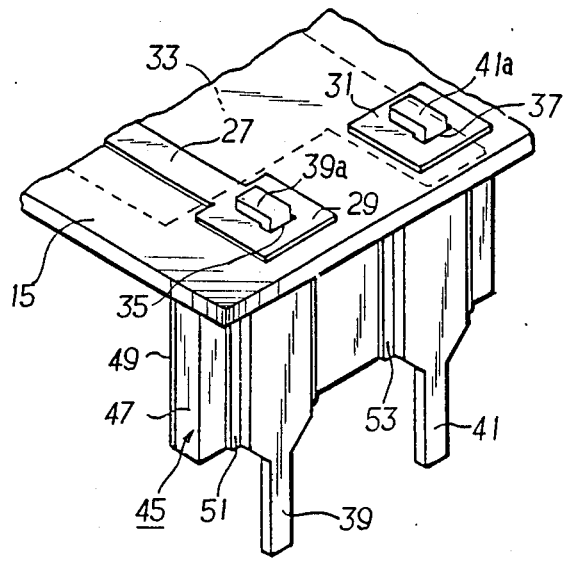
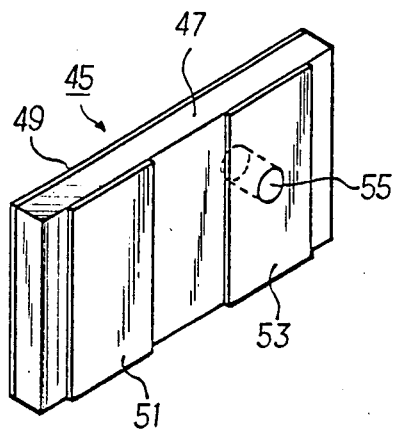
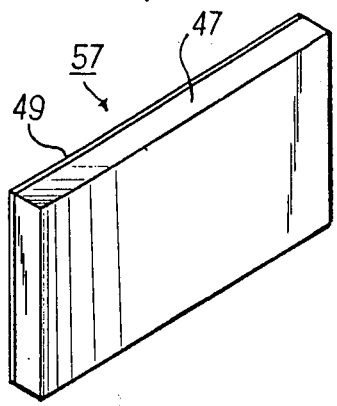

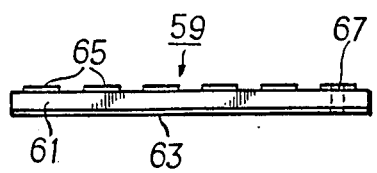
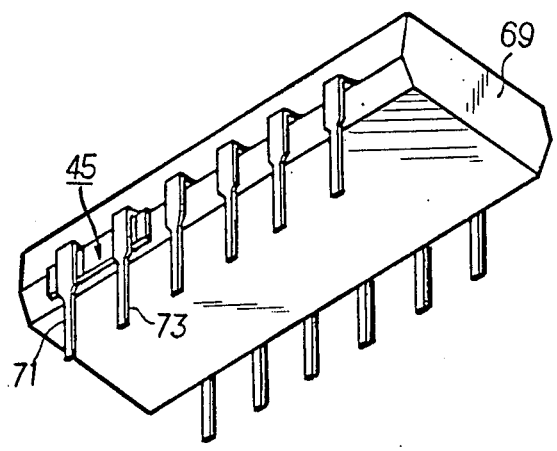
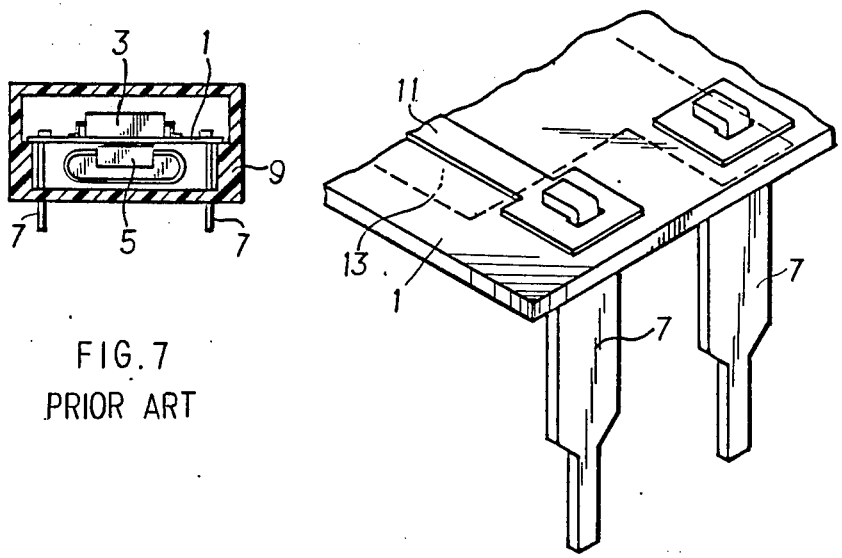
FIG. 7
PRIOR ART
PRIOR ART
FIG. 8

CONNECTION CONSTRUCTION FOR ELECTRONIC COMPONENT

BACKGROUND OF THE INVENTION

The present invention relates to the field of connection constructions for electronic components, and more specifically relates to such a connection construction which is particularly suitable for handling high speed signals.

In FIG. 7 of the accompanying drawings there is illustrated a prior art type of connecting structure for an electronic component. In this structure, electronic components designated as 3 and 5 are mounted to the upper and the lower surfaces in the figure of an electronic circuit board 1, and external connection terminals 7 (input and output terminals) are mounted to one edge of said circuit board 1, with said circuit board 1 being fixed at an intermediate position inside a synthetic resin case 9, and with said external connection terminals 7 projecting downwards through the bottom in the figure of said case 9.

In such a structure for providing connection for an electronic component, if as is per se known and as is shown in more detailed perspective view in FIG. 8 a ground plane 13 is formed on the lower side in the figure of the circuit board 1, so as to oppose a circuit pattern 11 formed (by printing or the like) on the upper side in the figure of said circuit board 1 and connected to the external connection terminals 7 and to the electronic components 3 and 5 (which are omitted from this figure) so as electrically to connect these elements together, then the circuit pattern 11 will act as a conductive strip having a certain characteristic impedance, and the degradation, such as distortion and/or attenuation, of a super high speed signal which is being transmitted between said electronic components 3 and 5 and said external connection terminals 7 will not develop.

However, the parts of the external connection terminals 7 which are connected to external circuits do not form such a transmission line with a certain characteristic impedance, and neither do the parts of said external connection terminals 7 which lead to said connection parts, i.e. the down legs as seen in FIGS. 7 and 8. Accordingly, the risk of mismatching exists in such a part of the construction, and there is likely to be degradation of the super high speed signal.

In particular, if the electronic components in the case 9 constitute a programmable variable delay line which incorporates, as electronic component parts, a super high speed electromagnetic delay line and a high speed IC such as an ECL for digitally switching over the delay time of this super high speed electromagnetic delay line, then it is difficult to drastically reduce the dimensions of the super high speed electromagnetic delay line, with the result that the overall size cannot be satisfactorily reduced, and the degree of mismatching at the external connection terminals 7 may not be at all negligible, due to the inevitably extended length of said external connection terminals 7.

SUMMARY OF THE INVENTION

Accordingly, it is the primary object of the present invention to provide a connection construction for an electronic component, which avoids the above described problems.

It is a further object of the present invention to provide such a connection construction for an electronic component, which allows easy impedance matching at external connection terminals which are connected to said electronic component.

It is a further object of the present invention to provide such a connection construction for an electronic component, which is free from undue deterioration or degradation, such as distortion and/or attenuation, of signals to be processed.

It is a yet further object of the present invention to provide such a connection construction for an electronic component, which is suitable for handling super high speed signals.

It is a yet further object of the present invention to provide such a connection construction for an electronic component, which is capable of being made very compact.

It is a yet further object of the present invention to provide such a connection construction particularly suitable for application to a programmable variable delay line which incorporates, as electronic component parts, a super high speed electromagnetic delay line and a high speed IC for digitally switching over the delay time of said super high speed electromagnetic delay line.

According to the present invention, these and other objects are accomplished by a connection construction for an electronic component, comprising: a circuit board; a circuit pattern on said circuit board; an external connection terminal mounted to said circuit board and connected to said circuit pattern; a ground electrode opposing said external connection terminal; and a mass of dielectric material interposed between said ground electrode and said external connection terminal.

According to the present invention, since said ground electrode is provided as opposing said external connection terminal via said mass of dielectric material, said external connection terminal functions as a transmission line having a certain desirable impedance.

BRIEF DESCRIPTION OF THE DRAWINGS

In the appended drawings, which should not be considered as limitative but only illustrative:

FIG. 1 is a partially sectional front view showing an electronic component incorporating the first preferred embodiment of the connection construction of the present invention;

FIG. 2 is a perspective view showing a portion of said first preferred embodiment connection construction utilized in said FIG. 1 electronic component;

FIG. 3 is a perspective view of an auxiliary base board which is a component of said connection construction;

FIG. 4 is a perspective view of an auxiliary base board included in a second preferred embodiment of the connection construction of the present invention;

FIG. 5 is a side view taken through a similar auxiliary base board included in a third preferred embodiment of the present invention;

FIG. 6 is a perspective view of a dual in line package type electronic component incorporating said third preferred embodiment connection construction;

FIG. 7 is a partially sectional front view of a electronic component incorporating a prior art type connection construction; and FIG. 8 is a perspective view showing a portion of said prior art connection construction of FIG. 7.

DESCRIPTION OF THE PREFERRED EMBODIMENTS

The present invention will now be described in detail in terms of the preferred embodiments thereof. FIG. 1 shows an electronic component incorporating the first preferred embodiment of the present invention. In this figure, the reference numeral 15 denotes a circuit board, and a super high speed IC (integrated circuit) 17 such as an ECL is mounted on the upper surface in the figure of this circuit board 15. On the reverse side of said circuit board 15 there is, as another component part, mounted a super high speed electromagnetic delay line 19, thus constituting a device for handling super high speed signals. Thereby, an electronic component is constituted which can, for example, be incorporated as a major component part of a programmable delay line (not particularly shown). Such a programmable delay line, as is per se known, outputs super high speed signals inputted into it after digitally switching over and changing the delay times of the signals. Such a type of electronic component as this is particularly suited for illustrating the merits of utilizing a connection construction according to the present invention.

This circuit board 15 is fixed, by means not particularly shown, inside a hollow box shaped case 21 made of insulating material such as synthetic resin or the like, in such a manner that its edges are placed on steps 23 provided on the inner surface of said case 21. The top of the case 21 is covered by a lid 25.

On the upper surface in the figure of the circuit board 15 there is formed, as particularly shown in the partial perspective view of FIG. 2, an electroconductive strip 27. This electroconductive strip 27 leads from a circuit pattern connected to the IC 17 and to the electromagnetic delay line 19 (neither being particularly shown in this figure) to its broadened end portion 29, located at the fringe of the circuit board 15, which constitutes a connection electrode for input and/or output (hereinafter referred to simply as an input connection electrode for purposes of simplicity). Thus, the electroconductive strip 27 constitutes a part of the circuit pattern for connecting the IC 17 and the electromagnetic delay line 19.

Further, there is formed on the fringe of the same side of the circuit board 15 as the connection electrode 29 and adjacent thereto, a ground connection electrode 31. And on the opposite side of the circuit board 15, extending in fact over most of its surface, there is formed a ground plane 33, which is electrically connected to the ground connection electrode 31 by suitable means, not particularly shown.

The circuit patterns on the two sides of the circuit board 15, including the electroconductive strip 27, the connection electrode 29, the ground connection electrode 31, and the ground plane 33, are formed by, for example, etching a base board plated on both its sides with copper.

A through hole 35 is formed through the connection electrode 29, and the free upper end portion 39a of an elongated generally planar input terminal 39 is passed therethrough from the under side in the figure and is bent around through approximately a right angle, so as to lie against said connection electrode 29 to which said end portion 39a is fixed, in the exemplary embodiment, by a quantity of solder not particularly shown in the figures. Thus, the main body of the input terminal 39 extends approximately at right angles to the body of the circuit board 15. Similarly, a through hole 37 is formed through the ground connection electrode 31, and the free upper end portion 41a of an elongated generally planar ground terminal 41 is passed therethrough from the under side in the figure and is bent around through approximately a right angle, so as to lie against said ground connection electrode 31 to which said end portion 41a is fixed, in this exemplary embodiment, again by a quantity of solder not particularly shown in the figures. Thus, the main body of the ground terminal 41 similarly extends approximately at right angles to the body of the circuit board 15. In FIG. 1, the reference numeral 43 denotes another connection terminal.

An auxiliary base board assembly 45, shown in perspective view on its own in FIG. 3 and in combination with the first preferred embodiment connection construction in FIG. 2, is made by securing a plate shaped auxiliary ground electrode 49 over one surface of an elongated planar dielectric plate 47, and by securing, on the other side of said dielectric plate 47, a pair of strip shaped connection electroconductive strips 51 and 53, said strips 51 and 53 being mutually parallel and spaced apart by a certain distance. The electroconductive strips 51 and 53 are made somewhat wider than the input terminal 39. And a through hole 55 through the dielectric plate 47 electrically connects the electroconductive strip 53 with the auxiliary ground electrode 49 in combination with electroconductive material (not shown) deposited on the inner surface thereof. In an alternative construction, however, it would also be possible to connect said electroconductive strip 53 with said auxiliary ground electrode 49 by a side strip passing around the edge of the dielectric plate 47, rather than by the through hole 55.

As is shown in FIG. 2, the auxiliary base board assembly 45 is secured electrically to the input terminal 39 and the ground terminal 41 by soldering. Thereby, also, electrical contact is ensured between said electroconductive strips 51 and 53 and said input terminal 39 and ground terminal 41, respectively, and further the ground terminal 41 is securely electrically connected to the auxiliary ground electrode 49, via the electroconductive strip 53 and the hole 55 as explained above. The assembly 45 can also be connected to the circuit board 15 by soldering the ground electrode 49 to the ground plane 33.

This first preferred embodiment of the connection construction of the present invention operates, during the operation of the shown electronic component, as follows. Since the connected combination of the input terminal 39 and the electroconductive strip 51 opposes the auxiliary ground electrode 49 closely with the intervention of the dielectric plate 47 of the auxiliary base board assembly 45 between them, and since said auxiliary ground electrode 49 is well and truly grounded by being connected via the electroconductive strip 53 and the hole 55 to the ground terminal 41, a substantial capacitance is created between said input terminal 39 and ground. Accordingly, there is effectively formed a transmission line serving as a microstrip for feeding a signal into the electronic component. Therefore, by selecting the relative permittivity and the thickness of the dielectric plate 47, the width of the electroconductive strip 51, and other parameters of the construction, so as to obtain a certain appropriate impedance with the auxiliary base board assembly 45 mounted to the input terminal 39, this programmable delay line and the external circuit to which it is to be connected can be properly matched together.

The auxiliary base board assembly 45 incorporated in the present invention is not to be considered as limited by the particular construction shown. In particular, the electroconductive strips 51 and 53 are not essential. In FIG. 4, in a manner similar to the perspective view of FIG. 3 relating to the first preferred embodiment, there is shown an auxiliary base board assembly 57 of a second preferred embodiment of the present invention. This auxiliary base board assembly 57 does not include any electroconductive strips, but only has the auxiliary ground electrode 49 formed on the side of the dielectric plate 47 remote from the terminals 39 and 41; and in this case these terminals 39 and 41 are fixed to their surface of said dielectric plate 47 by being, for example, adhered with a thermal pression type adhesive. In this construction, it is considered preferable to connect the auxiliary ground electrode 49 of the auxiliary base board assembly 57 to the ground electrode 33 on the circuit board 15, with the auxiliary base board assembly 57 secured to the reverse side of said circuit board 15 as shown in FIG. 1. And, if this is done in the first preferred embodiment of FIGS. 1 through 3, the through hole 55 can be omitted. However, this type of construction may be subject to the problem that the adhesion between the dielectric plate 47 and the terminals 39 and 41 may be deteriorated, for example peeled off, by the action of heat conducted through the terminals 39 and 41 during the process of soldering this component into an external circuit. At the very least, such deterioration of adhesion or peeling off may result in the alteration of the distance maintained between the auxiliary ground electrode 49 and the terminals 39 and 41, which will alter the electrical properties of the connection construction and likely deteriorate its performance in practice. Accordingly, from the point of view of maintaining fail safe characteristics, it is considered that the first preferred embodiment construction of FIGS. 1 through 3, incorporating the electroconductive strip 51 and 53 fixed to the dielectric plate 47 of the auxiliary base board assembly 57 and themselves fixed, by soldering, to the terminals 39 and 41 which extend to the outside, is preferable.

In FIG. 5, there is shown in side view the auxiliary base board assembly 59 of a third preferred embodiment of the connecting construction of the present invention. In this embodiment, the auxiliary base board assembly 59 is made by forming a ground electrode 63 over the whole of one surface of an elongated dielectric plate 61, and by forming on the other side thereof a plurality of electroconductive strips 65, parallel to one another and spaced apart at the same pitch as the input and output terminals of the component to which this base board assembly 59 is to be fitted. The reference numeral 67 denotes a through hole which electrically connects the ground electrode 63 through the dielectric plate 61 to one of the electroconductive strips 65 which is, in use, grounded by being connected to a ground terminal; this through hole 67 has an electroconductive lining for conducting electricity, like the hole 55 of the first preferred embodiment shown in FIG. 3. The connection of this auxiliary base board assembly 59 to the component with which it is to be used is performed in the same way as shown in FIG. 2 for the first preferred embodiment.

Now, in the connecting construction of the present invention, the shape of the input terminal 39 and the ground terminal 41 is not to be considered as restricted to the exemplary shown planar shape. Rather, these terminals may be round or may have other cross sectional shapes, as appropriate for the particular application. Further, these terminals are not limited to being input terminals and ground terminals, but may further be output terminals or control terminals or any other sort of terminals.

Further, since what is required is to make the external connection terminals constitute transmission lines, the objects of the present invention may be sufficiently attained if the ground electrode is extended as far as practicable in relation with the external terminals by way of dielectric material.

Yet further, the portions where the auxiliary base boards 45, 57, and 59 of the various embodiments disclosed are mounted to the input terminals 39 and the ground terminals 41 are not to be considered as limited to being inside the case 21. For example, it is possible to mount an auxiliary base board 45 such as the one shown in FIG. 3 on the exterior of a case 69 of an electronic component such as a multi pin IC packaged in the form of a dual in line package (in which the electronic component parts are package molded by synthetic resin and the external connection terminals are protruded sideways from said mold case 69), so as to cooperate with terminals 71 and 73 thereof, as illustrated in perspective view in FIG. 6. Similar treatment could be meted out to the base boards 57 and 59, shown in FIGS. 4 and 5, of the second and third preferred embodiments disclosed above.

Further, the present invention is not limited to the field of mounting of such electronic components as programmable delay lines, but, for example, could be applied to various other types of electronic components which had external connections. However, the present invention has particular special advantages when applied to electronic components in which the external connection terminals tend to be long, or ones in which timing is critical such as programmable delay lines.

Although the present invention has been shown and described in terms of certain preferred embodiments, and with reference to the appended drawings, it should not be considered as being particularly limited thereby, since the details could be varied without departing from the concept of the invention. Accordingly, the scope of the present invention is to be delimited solely by the following claims.

What is claimed is:

1. A connection construction for an electronic component, comprising:
   a circuit board;
   a circuit pattern formed on the circuit board;
   at least one external connection terminal connected to the circuit pattern and projecting substantially perpendicularly from the circuit board, said at least one external connection terminal being of elongated shape and having a first wide portion and a second narrower portion;
   a dielectric plate having a first surface and a second surface, the first surface of the dielectric plate being affixed to only the first portion of said at least one external connection terminal, the second portion projecting downwardly therefrom for external connection; and
   a ground electrode affixed to the second surface of the dielectric layer.

2. A device as claimed in claim 1, wherein the dielectric plate is affixed to the circuit board.

3. A device as claimed in claim 1, wherein the circuit board has a ground plane formed on one side thereof, and an edge of the ground electrode is affixed to said ground plane.

4. A connection construction for an electronic component, comprising:
   a circuit board;
   a circuit pattern formed on the circuit board;
   at least one external connection terminal connected to the circuit pattern and projecting substantially perpendicularly from the circuit board said at least one external connection terminal being of elongated shape and having a first wide portion and a second narrower portion;
   a conductive strip affixed to only the first portion of said at least one external connection terminal, the second portion projecting downwardly therefrom for external connection;
   a dielectric plate having a first surface and a second surface, the first surface of the dielectric plate being affixed to said conductive strip; and
   a ground electrode affixed to the second surface of the dielectric layer.

5. A device as claimed in claim 4, wherein said at least one external connection terminal is a ground terminal; the conductive strip affixed to the ground terminal, the dielectric plate, and the ground electrode each have a hole therein; and the ground electrode is electrically connected to the conductive strip attached to the ground terminal through said hole.

6. A device as claimed in claim 4, wherein the dielectric plate is affixed to the circuit board.

7. A device as claimed in claim 4, wherein the circuit board has a ground plane formed on one side thereof, and an edge of the ground electrode is affixed to said ground plane.

8. A connection construction for an electronic component, comprising:
   an insulating case;
   at least one electronic component, package molded in said insulating case;
   at least one external connection terminal connected to the at least one electronic component and projecting substantially perpendicularly from the insulation case, said at least one external connecting terminal being of elongated shape and having a first wide portion and a second narrower portion;
   a dielectric plate having a first surface and a second surface, the first surface of the dielectric plate being affixed to only the first portion of said at least one external connection terminal, the second portion projecting downwardly therefrom for external connection; and
   a ground electrode affixed to the second surface of the dielectric layer.

9. A connection construction for an electronic component, comprising:
   an insulating case;
   at least one electronic component, package molded in said insulating case;
   at least one external connection terminal connected to the at least one electronic component and projecting substantially perpendicularly from the insulating case, said at least one external connection terminal being of elongated shape and having a first wide portion and a second narrower portion;
   a conductive strip affixed to only the first portion of said at least one external connection terminal, the second portion projecting downwardly therefrom for external connection;
   a dielectric plate having a first surface and a second surface, the first surface of the dielectric plate being affixed to said conductive strip; and
   a ground electrode affixed to the second surface of the dielectric layer.

10. A device as claimed in claim 9, wherein said at least one external connection terminal is a ground terminal; the conductive strip affixed to the ground terminal, the dielectric plate, and the ground electrode each have a hole therein; and the ground electrode is electrically connected to the conductive strip attached to the ground terminal through said hole.

* * * * *